United States Patent
Kwak

(10) Patent No.: US 9,425,774 B1
(45) Date of Patent: Aug. 23, 2016

(54) SEMICONDUCTOR APPARATUS

(71) Applicant: SK hynix Inc., Icheon-si Gyeonggi-do (KR)

(72) Inventor: Noh Hyup Kwak, Icheon-si (KR)

(73) Assignee: SK HYNIX INC., Icheon-Si (KR)

( * ) Notice: Subject to any disclaimer, the term of this patent is extended or adjusted under 35 U.S.C. 154(b) by 0 days.

(21) Appl. No.: 14/725,142

(22) Filed: May 29, 2015

(30) Foreign Application Priority Data

Feb. 27, 2015 (KR) .......................... 10-2015-0028348

(51) Int. Cl.
*H03M 9/00* (2006.01)
*H03K 3/037* (2006.01)

(52) U.S. Cl.
CPC ..................................... *H03K 3/037* (2013.01)

(58) Field of Classification Search
CPC .... H03M 9/00; H02J 7/0024; H04N 1/32475; H04N 21/23602; G11C 19/00; H03K 3/037
USPC .................................................. 341/101, 100
See application file for complete search history.

(56) References Cited

U.S. PATENT DOCUMENTS

| | | | |
|---|---|---|---|
| 6,430,242 B1 * | 8/2002 | Buchanan ............ | G11C 7/1078 326/93 |
| 6,611,217 B2 * | 8/2003 | Buchanan ............ | G11C 7/1078 341/100 |
| 6,650,661 B1 * | 11/2003 | Buchanan ............... | H03M 9/00 326/32 |
| 2009/0067259 A1 * | 3/2009 | Park ........................ | G11C 7/10 365/189.02 |
| 2013/0050176 A1 * | 2/2013 | Kim ........................ | G09G 3/36 345/214 |

FOREIGN PATENT DOCUMENTS

KR   1020010102404 A   11/2001
KR   1020060013127 A   2/2006

* cited by examiner

*Primary Examiner* — Jean B Jeanglaude
(74) *Attorney, Agent, or Firm* — William Park & Associates Ltd.

(57) ABSTRACT

A semiconductor apparatus may include a data alignment block configured to convert parallel type data into rising data and falling data, and output the rising data and the falling data as serial type synchronous data. The semiconductor apparatus may include a driving control block configured to compare levels of respective bits of the serial type synchronous data, and generate a driving control signal. The semiconductor apparatus may include a data output driving block configured to change a driving force in response to the driving control signal, drive the serial type synchronous data with the driving force, and output an output data.

20 Claims, 5 Drawing Sheets

SEMICONDUCTOR APPARATUS

CROSS-REFERENCES TO RELATED APPLICATION

The present application claims priority under 35 U.S.C. §119(a) to Korean application number 10-2015-0028348, filed on Feb. 27, 2015, in the Korean Intellectual Property Office, which is incorporated herein by reference in its entirety.

BACKGROUND

1. Technical Field

Various embodiments generally relate to a semiconductor integrated circuit, and more particularly, to a semiconductor apparatus.

2. Related Art

A semiconductor apparatus is configured to receive an electrical signal. The semiconductor apparatus is configured to perform a specified operation according to the signal, and output an electrical signal.

Because a semiconductor apparatus operates at high speeds, technologies related to precisely receiving a signal has become important. Also, technologies that relate to outputting a precise signal from the semiconductor apparatus have become important as well.

In particular, whether a semiconductor apparatus outputting data at a high speed outputs precise data may serve as a yardstick for determining the performance of the semiconductor apparatus.

SUMMARY

In an embodiment, there may be provided a semiconductor apparatus. The semiconductor apparatus may include a data alignment block configured to convert parallel type data into rising data and falling data, and output the rising data and the falling data as serial type synchronous data. The semiconductor apparatus may include a driving control block configured to compare levels of respective bits of the serial type synchronous data, and generate a driving control signal. The semiconductor apparatus may include a data output driving block configured to change a driving force in response to the driving control signal, drive the serial type synchronous data with the driving force, and output an output data.

In an embodiment, there may be provided a semiconductor apparatus. The semiconductor apparatus may include a data alignment block configured to convert parallel type data into rising data and falling data, and output the rising data and the falling data as serial type synchronous data. The semiconductor apparatus may include a driving control block configured to enable a driving control signal when a value of data is changed after the same data value is continuously retained for at least 2 bits in the serial type synchronous data. The semiconductor apparatus may include a data output driving block configured to drive the serial type synchronous data with a driving force changeable according to the driving control signal, and output output data.

In an embodiment, there may be provided a semiconductor apparatus. The semiconductor apparatus may include a data output driving block configured to change a driving force in response to a driving control signal, drive synchronous data with the changed driving force, and output an output data. The semiconductor apparatus may include a driving control block configured to generate the driving control signal in response to values of consecutive data of the synchronous data.

DETAILED DESCRIPTION

Hereinafter, a semiconductor apparatus will be described below with reference to the accompanying drawings through various examples of embodiments.

Figure 1:
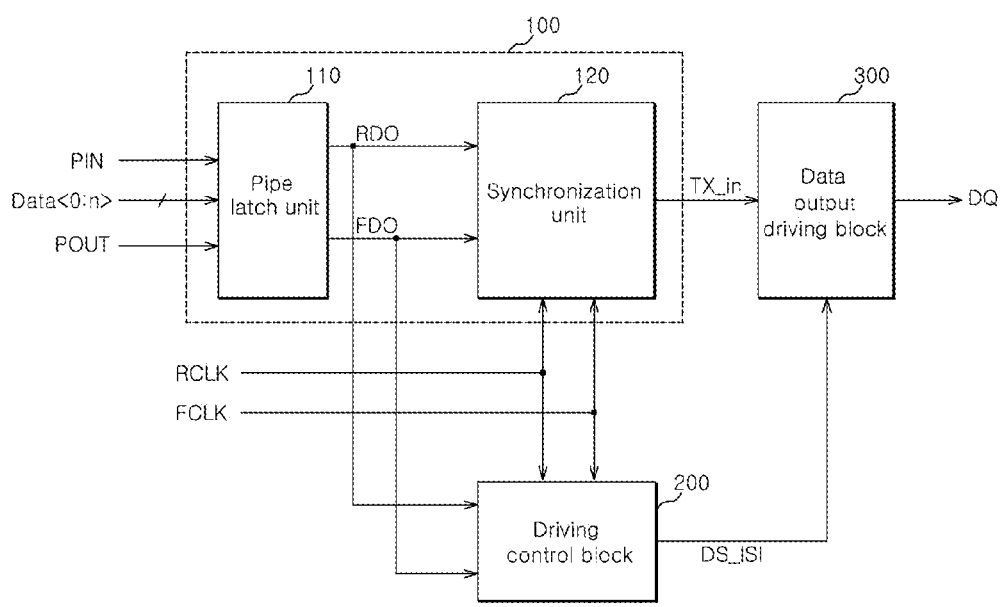
FIG. 1 is a configuration diagram illustrating a representation of an example of a semiconductor apparatus in accordance with an embodiment.

Referring to FIG. 1, a semiconductor apparatus in accordance with an embodiment may include a data alignment block 100, a driving control block 200, and a data output driving block 300.

The data alignment block 100 may receive parallel type data Data<0:n> and output the parallel type data Data<0:n> as serial type synchronous data TX_in. The data alignment block 100 may output the parallel type data Data<0:n> as serial type synchronous data TX_in in response to a pipe input signal PIN, a pipe output signal POUT, a rising clock RCLK signal and a falling clock FCLK signal. For example, the data alignment block 100 receives and stores the parallel type data Data<0:n> when the pipe input signal PIN is enabled, and outputs the stored parallel type data Data<0:n> as the serial type synchronous data TX_in in synchronization with the rising clock RCLK and the falling clock FCLK according to a predetermined order when the pipe output signal POUT is enabled.

The data alignment block 100 may include a pipe latch unit 110 and a synchronization unit 120.

The pipe latch unit 110 receives the parallel type data Data<0:n> and outputs the parallel type data Data<0:n> as rising data RDO and falling data FDO. The pipe latch unit 110 may output the parallel type data Data<0:n> as rising data RDO and falling data FDO in response to the pipe input signal PIN and the pipe output signal POUT. For example, the pipe latch unit 110 receives and stores the parallel type data Data<0:n> when the pipe input signal PIN is enabled. For example, the pipe latch unit 110 outputs the data stored by the pipe input signal PIN, as the rising data RDO and the falling data FDO according to the predetermined order when the pipe output signal POUT is enabled.

The synchronization unit 120 may receive the rising data RDO and the falling data FDO and may output the rising data RDO and the falling data FDO as the synchronous data TX_in. The synchronization unit 120 may output the rising data RDO and the falling data FDO as the synchronous data TX_in in response to the rising clock RCLK and the falling clock FCLK. For example, the synchronization unit 120 outputs the synchronous data TX_in by synchronizing the rising data RDO with the rising clock RCLK and synchronizing the falling data FDO with the falling clock FCLK. The rising clock RCLK and the falling clock FCLK may be clocks with the same frequency, and the rising timing of the rising clock RCLK and the falling timing of the falling clock FCLK may be the same. The odd-numbered data of the synchronous data TX_in may be, for example, the rising data RDO synchronized with the rising clock RCLK. The even-numbered data of the synchronous data TX_in may be, for example, the falling data FDO synchronized with the falling clock FCLK. The synchronization unit 120 may alternately output the rising data RDO and the falling data FDO as the synchronous data TX_in.

The driving control block 200 may be configured to enable a driving control signal DS_ISI when, for example, the value of data is changed after the same data value is continuously retained for at least 2 bits in the synchronous data TX_in. Describing the driving control block 200, the driving control block 200 may generate the driving control signal DS_ISI in response to the rising data RDO, the falling data FDO, the rising clock RCLK and the falling clock FCLK. For example, the driving control block 200 synchronizes the rising data RDO and the falling data FDO with the rising clock RCLK and the falling clock FCLK, compares the synchronized data, determines whether the values of consecutively outputted data are the same, and generates the driving control signal DS_ISI according to a determination result.

The data output driving block 300 may drive the synchronous data TX_in, and may output output data DQ. The data output driving block 300 drives the synchronous data TX_in with a larger driving force when, for example, the driving control signal DS_ISI is enabled than when, for example, the driving control signal DS_ISI is disabled, and outputs the output data DQ.

Figure 2:
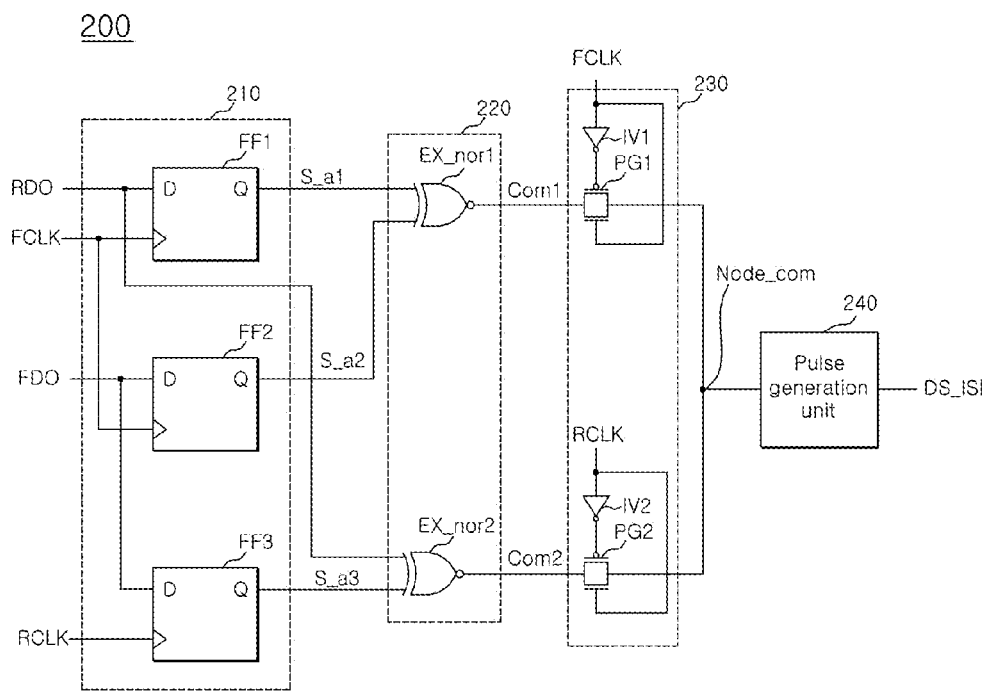
FIG. 2 is a configuration diagram illustrating a representation of an example of the driving control block illustrated in FIG. 1.

Referring to FIG. 2, the driving control block 200 may include a synchronous signal generation unit 210, and a comparison unit 220. The driving control block may include an output selection unit 230, and a pulse generation unit 240.

The synchronous signal generation unit 210 aligns the rising data RDO and the falling data FDO in order to compare the rising data RDO and the falling data FDO at the same time. For example, the synchronous signal generation unit 210 may output a first synchronous signal S_a1 by synchronizing the rising data RDO with the falling clock FCLK. For example, synchronous signal generation unit 210 may output a second synchronous signal S_a2 by synchronizing the falling data FDO with the falling clock FCLK. For example, synchronous signal generation unit 210 may output a third synchronous signal S_a3 by synchronizing the falling data FDO with the rising clock RCLK.

The synchronous signal generation unit 210 may include first to third flip-flops FF1, FF2 and FF3.

The first flip-flop FF1 latches the rising data RDO when, for example, the falling clock FCLK transitions to a high level, and outputs the first synchronous signal S_a1. The first flip-flop FF1 receives the rising data RDO through a data input terminal. The first flip-flop FF1 receives the falling clock FCLK through a clock input terminal. The first flip-flop FF1 outputs the first synchronous signal S_a1 through an output terminal.

The second flip-flop FF2 latches the falling data FDO when, for example, the falling clock FCLK transitions to the high level, and outputs the second synchronous signal S_a2. The second flip-flop FF2 receives the falling data FDO through a data input terminal. The second flip-flop FF2 receives the falling clock FCLK through a clock input terminal. The second flip-flop FF2 outputs the second synchronous signal S_a2 through an output terminal.

The third flip-flop FF3 latches the falling data FDO when, for example, the rising clock RCLK transitions to a high level, and outputs the third synchronous signal S_a3. The third flip-flop FF3 receives the falling data FDO through a data input terminal. The third flip-flop FF3 receives the rising clock RCLK through a clock input terminal. The third flip-flop FF3 outputs the third synchronous signal S_a3 through an output terminal.

The comparison unit 220 may compare the first synchronous signal S_a1 and the second synchronous signal S_a2 and generate a first comparison signal Com1. The comparison unit 220 may compare the rising data RDO and the third synchronous signal S_a3 and generate a second comparison signal Com2. For example, the comparison unit 220 enables the first comparison signal Com1 when, for example, the first synchronous signal S_a1 and the second synchronous signal S_a2 are the same level, and disables the first comparison signal Com1 when, for example, the first synchronous signal S_a1 and the second synchronous signal S_a2 are different levels. The comparison unit 220 enables the second comparison signal Com2 when, for example, the rising data RDO and the third synchronous signal S_a3 are the same level, and disables the second comparison signal Com2 when, for example the rising data RDO and the third synchronous signal S_a3 are different levels.

The comparison unit 220 may include logic gates. For example, the comparison unit 200 may include, for example but not limited to, first and second exclusive NOR gates EX_nor1 and EX_nor2.

The first exclusive NOR gate EX_nor1 enables the first comparison signal Com1 when, for example, the first and second synchronous signals S_a1 and S_a2 are the same level. The first exclusive NOR gate EX_nor1 disables the first comparison signal Com1 when, for example, the first and second synchronous signals S_a1 and S_a2 are different levels. The first exclusive NOR gate EX_nor1 receives the first and second synchronous signals S_a1 and S_a2 and outputs the first comparison signal Com1.

The second exclusive NOR gate EX_nor2 enables the second comparison signal Com2 when, for example, the rising data RDO and the third synchronous signal S_a3 are the same level. The second exclusive NOR gate EX_nor2 disables the second comparison signal Com2 when, for example, the rising data RDO and the third synchronous signal S_a3 are different levels. The second exclusive NOR gate EX_nor2 receives the rising data RDO and the third synchronous signal S_a3 and outputs the second comparison signal Com2.

The output selection unit 230 may alternately output the first and second comparison signals Com1 and Com2 to a comparison node Node_com. The output selection unit 230 may alternately output the first and second comparison signals Com1 and Com2 to a comparison node Node_com in response to the falling clock FCLK and the rising clock RCLK. For example, the output selection unit 230 outputs the first comparison signal Com1 to the comparison node Node_com in the example where the falling clock FCLK is at the high level, and outputs the second comparison signal Com2 to the comparison node Node_com in the example where the rising clock RCLK is at the high level.

The output selection unit 230 may include first and second pass gates PG1 and PG2, and first and second inverters IV1 and IV2. The first inverter IV1 may receive the falling clock FCLK. The first pass gate PG1 may receive the output signal of the first inverter IV1 through a first control terminal. The first pass gate PG1 may receive the falling clock FCLK through a second control terminal. The first pass gate PG1 may receive the first comparison signal Com1 through an input terminal. The first pass gate PG1 may be coupled to the comparison node Node_com through an output terminal. The second inverter IV2 may receive the rising clock RCLK. The second pass gate PG2 may receive the output signal of the second inverter IV2 through a first control terminal. The second pass gate PG2 may receive the rising clock RCLK through a second control terminal. The second pass gate PG2 may receive the second comparison signal Com2 through an input terminal. The second pass gate PG2 may be coupled to the comparison node Node_com through an output terminal.

The pulse generation unit 240 may generate a pulse at the falling timing of the comparison node Node_com, and output the driving control signal DS_ISI. For example, the pulse generation unit 240 generates a pulse when the comparison node Node_com transitions from a high level to a low level, and output the driving control signal DS_ISI. The pulse generation unit 240 may generate the driving control signal DS_ISI which is enabled for a predetermined time, when the comparison node Node_com transitions from the high level to the low level.

Figure 3:
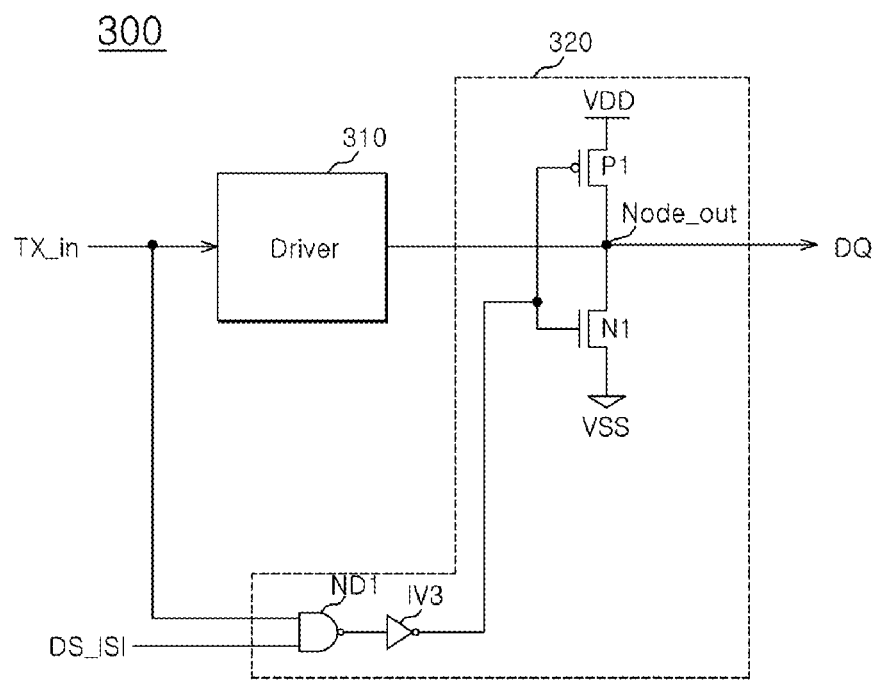
FIG. 3 is a configuration diagram illustrating a representation of an example of the data output driving block illustrated in FIG. 1.

Referring to FIG. 3, the data output driving block 300 may include a driver 310 and a control driver 320.

The driver 310 may drive the synchronous data TX_in with a predetermined driving force, and output the output data DQ. For example, the driver 310 may drive the synchronous data TX_in with the driving force predetermined by a calibration code (not illustrated), and may output the output data DQ. For example, the driver 310 drives an output node Node_out with the predetermined driving force in response to the synchronous data TX_in, and the voltage level of the output node Node_out is outputted as the output data DQ.

The control driver 320 may drive the synchronous data TX_in and output the output data DQ only when, for example, the driving control signal DS_ISI is enabled. For example, the control driver 320 drives the output node Node_out in response to the synchronous data TX_in only when the driving control signal DS_ISI is enabled, and the voltage level of the output node Node_out is outputted as the output data DQ.

The control driver 320 may include a NAND gate ND1, a third inverter IV3, and first and second transistors P1 and N1. The NAND gate ND1 receives the synchronous data TX_in and the driving control signal DS_ISI. The third inverter IV3 receives the output signal of the NAND gate ND1. A gate of the first transistor P1 receives the output signal of the third inverter IV3. A source of the first transistor P1 is applied with an external voltage VDD. A drain of the first transistor P1 is coupled to the output node Node_out. A gate of the second transistor N1 receives the output signal of the third inverter IV3. A drain of the second transistor N1 is coupled to the output node Node_out. A source of the second transistor N1 is coupled to a ground terminal VSS.

Operations of the semiconductor apparatus in accordance with an example of an embodiment, configured as mentioned above, will be described below.

The pipe latch unit 110 stores the parallel type data Data<0:n> when the pipe input signal PIN is enabled. The pipe latch unit 110 outputs the stored data as the rising data RDO and the falling data FDO according to the predetermined order in response to the pipe output signal POUT.

The synchronization unit 120 outputs the synchronous data TX_in by synchronizing the rising data RDO with the rising clock RCLK and synchronizing the falling data FDO with the falling clock FCLK. The synchronization unit 120 alternately outputs the synchronized rising data RDO and the synchronized falling data FDO as the synchronous data TX_in.

Therefore, the data alignment block 100 including the pipe latch unit 110 and the synchronization unit 120 latches the parallel type data Data<0:n> in response to the pipe input signal PIN. The data alignment block 100 aligns the latched data as the rising data RDO and the falling data FDO in response to the pipe output signal POUT. The data alignment block 100 alternately outputs the rising data RDO and the falling data FDO as the synchronous data TX_in in response to the rising clock RCLK and the falling clock FCLK.

The driving control block 200 enables the driving control signal DS_ISI when the value of data is changed after the same data value is continuously retained for at least 2 bits in the synchronous data TX_in. The driving control block 200 compares the rising data RDO and the falling data FDO which are to be outputted as the synchronous data TX_in, and enables the driving control signal DS_ISI when the value of data is changed after the same data value continuously retained for at least 2 bits in the synchronous data TX_in.

Referring to FIG. 2, the synchronous signal generation unit 210 of the driving control block 200 outputs the first synchronous signal S_a1 by synchronizing the rising data RDO with the rising timing of the falling clock FCLK. The synchronous signal generation unit 210 of the driving control block 200 outputs the second synchronous signal S_a2 by synchronizing the falling data FDO with the rising timing of the falling clock FCLK. The synchronous signal generation unit 210 of the driving control block 200 outputs the third synchronous signal S_a3 by synchronizing the falling data FDO with the rising timing of the rising clock RCLK.

The comparison unit 220 of the driving control block 200 enables the first comparison signal Com1 to a high level when the first and second synchronous signals S_a1 and S_a2 are the same level. The comparison unit 220 of the driving control block 200 disables the first comparison signal Com1 to a low level when the first and second synchronous signals S_a1 and S_a2 are different levels. The comparison unit 220 enables the second comparison signal Com2 to a high level when the rising data RDO and the third synchronous signal S_a3 are the same level. The comparison unit 220 disables the second comparison signal Com2 to a low level when the rising data RDO and the third synchronous signal S_a3 are different levels.

The output selection unit 230 outputs the first comparison signal Com1 to the comparison node Node_com in the example where the level of the falling clock FCLK is the high level. The output selection unit 230 outputs the second comparison signal Com2 to the comparison node Node_com in the example where the level of the rising clock RCLK is the high level.

The pulse generation unit 240 generates the driving control signal DS_ISI which is enabled for the predetermined time, when the comparison node Node_com transitions from the high level to the low level.

The data output driving block 300 drives the synchronous data TX_in, and outputs the output data DQ. The data output driving block 300 drives the synchronous data TX_in with a larger driving force when the driving control signal DS_ISI is enabled than when the driving control signal DS_ISI is disabled, and outputs the output data DQ.

Further descriptions will be made below with reference to FIG. 4.

Figure 4:
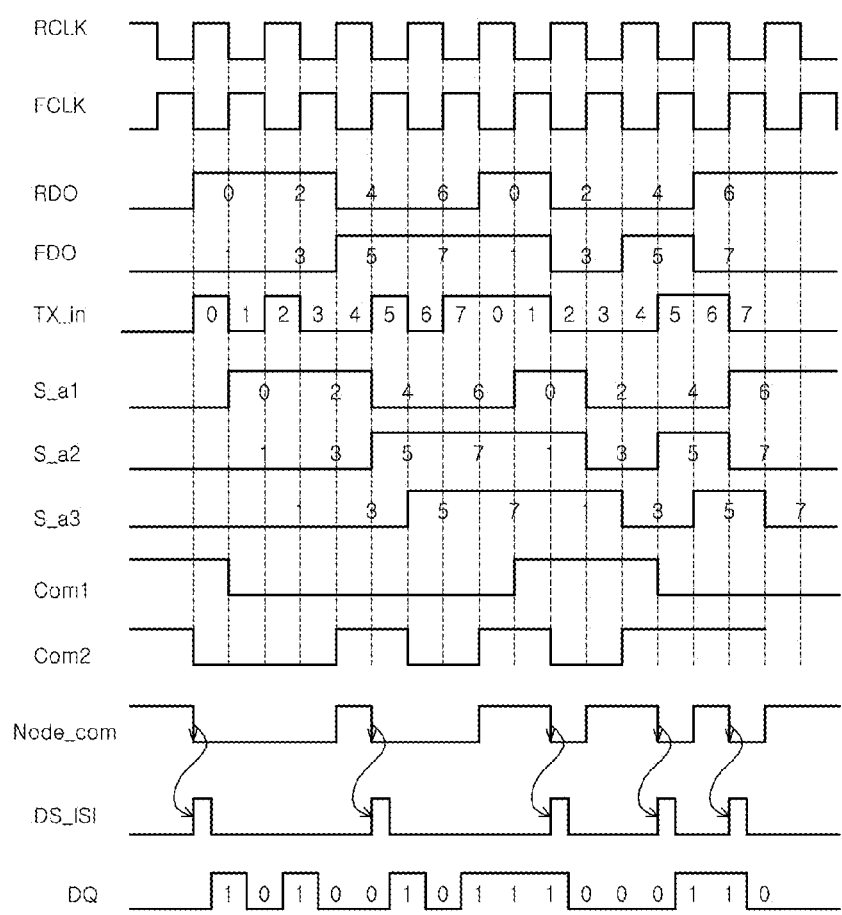
FIG. 4 is a representation of an example of a timing diagram to assist in the explanation of operations of the semiconductor apparatus in accordance with an embodiment.

It may be assumed, for example, that the rising clock RCLK, the falling clock FCLK, the rising data RDO and the falling data FDO are generated as illustrated in FIG. 4.

For example, the rising data RDO is outputted as the first synchronous signal S_a1 in synchronization with the falling clock FCLK. The rising data RDO is latched each time the falling clock FCLK transitions to the high level, and a latched signal is outputted as the first synchronous signal S_a1. Thus, the first synchronous signal S_a1 is outputted as a signal delayed by ½ cycle of the rising clock RCLK when compared to the rising data RDO.

The falling data FDO is outputted as the second synchronous signal S_a2 in synchronization with the falling clock FCLK. The falling data FDO is latched each time the falling clock FCLK transitions to the high level, and a latched signal is outputted as the second synchronous signal S_a2. Thus, the first and second synchronous signals S_a1 and S_a2, as signals which are synchronized with the falling clock FCLK, are signals of which levels may be changed each time the falling clock FCLK transitions to the high level.

The falling data FDO is outputted as the third synchronous signal S_a3 in synchronization with the rising clock RCLK. Thus, the third synchronous signal S_a3 is a signal delayed by ½ cycle when compared to the second synchronous signal S_a2 synchronized with the falling clock FCLK.

The first synchronous signal S_a1 is a signal delayed by ½ cycle when compared to the rising data RDO, the second synchronous signal S_a2 is a signal delayed by ½ cycle when compared to the falling data FDO, and the third synchronous signal S_a3 is a signal which is delayed by ½ cycle when compared to the second synchronous signal S_a2. Therefore, the third synchronous signal S_a3 is a signal delayed by one cycle when compared to the falling data FDO, and also has a difference corresponding to one cycle when compared to the rising data RDO.

The synchronous data TX_in is a signal in which the rising data RDO and the falling data FDO are alternately outputted. For example, the first data 0 of the synchronous data TX_in is the first data 0 of the rising data RDO, and the second data 1 of the synchronous data TX_in is the first data 1 of the falling data FDO. The third data 2 of the synchronous data TX_in is the second data 2 of the rising data RDO, and the fourth data 3 of the synchronous data TX_in is the second data 3 of the falling data FDO. The fifth data 4 of the synchronous data TX_in is the third data 4 of the rising data RDO, and the sixth data 5 of the synchronous data TX_in is the third data 5 of the falling data FDO. The seventh data 6 of the synchronous data TX_in is the fourth data 6 of the rising data RDO, and the eighth data 7 of the synchronous data TX_in is the fourth data 7 of the falling data FDO.

The first comparison signal Com1, as a signal which is generated by a result of comparing the first synchronous signal S_a1 and the second synchronous signal S_a2, is a signal enabled to the high level when the first and second synchronous signals S_a1 and S_a2 are the same level and is disabled to the low level when the first and second synchronous signals S_a1 and S_a2 are different levels. The first synchronous signal S_a1, as a signal which is generated as the rising data RDO is delayed by ½ cycle, has a level corresponding to the rising data RDO. The second synchronous signal S_a2, as a signal which is generated as the falling data FDO is delayed by ½ cycle, has a level corresponding to the falling data FDO. Therefore, the first comparison signal Com1 represents a result of comparing the first data 0 of the rising data RDO and the first data 1 of the falling data FDO and a result of comparing the second data 2 of the rising data RDO and the second data 3 of the falling data FDO. The first comparison signal Com1 represents a result of comparing the third data 4 of the rising data RDO and the third data 5 of the falling data FDO and a result of comparing the fourth data 6 of the rising data RDO and the fourth data 7 of the falling data FDO.

The first comparison signal Com1 represents a result of comparing the first data 0 of the synchronous data TX_in and the second data 1 of the synchronous data TX_in, a result of comparing the third data 2 of the synchronous data TX_in and the fourth data 3 of the synchronous data TX_in, a result of comparing the fifth data 4 of the synchronous data TX_in and the sixth data 5 of the synchronous data TX_in, and a result of comparing the seventh data 6 of the synchronous data TX_in and the eighth data 7 of the synchronous data TX_in.

The second comparison signal Com2, as a signal which is generated by a result of comparing the rising data RDO and the third synchronous signal S_a3, is a signal enabled to the high level when the rising data RDO and the third synchronous signal S_a3 are the same level and is disabled to the low level when the rising data RDO and the third synchronous signal S_a3 are different levels. The third synchronous signal S_a3, as a signal which is generated as the falling data FDO is delayed by one cycle, has a level corresponding to the falling data FDO. Therefore, the second comparison signal Com2 represents a result of comparing the second data 2 of the rising data RDO and the first data 1 of the falling data FDO and a result of comparing the third data 4 of the rising data RDO and the second data 3 of the falling data FDO. The second comparison signal Com2 represents a result of comparing the fourth data 6 of the rising data RDO and the third data 5 of the falling data FDO and a result of comparing the first data 0 of the rising data RDO and the fourth data 7 of the falling data FDO.

The second comparison signal Com2 represents a result of comparing the second data 1 of the synchronous data TX_in and the third data 2 of the synchronous data TX_in, a result of comparing the fourth data 3 of the synchronous data TX_in and the fifth data 4 of the synchronous data TX_in, a result of comparing the sixth data 5 of the synchronous data TX_in and the seventh data 6 of the synchronous data TX_in, and a result of comparing the eighth data 7 of the synchronous data TX_in and the first data 0 of the synchronous data TX_in.

As a result, the first comparison signal Com1 represents a result of comparing the first data 0 and the second data 1 of the synchronous data TX_in, a result of comparing the third data 2 and the fourth data 3 of the synchronous data TX_in, a result of comparing the fifth data 4 and the sixth data 5 of the synchronous data TX_in, and a result of comparing the seventh data 6 and the eighth data 7 of the synchronous data TX_in. The second comparison signal Com2 represents a result of comparing the second data 1 and the third data 2 of the synchronous data TX_in, a result of comparing the fourth data 3 and the fifth data 4 of the synchronous data TX_in, a result of comparing the sixth data 5 and the seventh data 6 of the synchronous data TX_in, and a result of comparing the eighth data 7 and the first data 0 of the synchronous data TX_in.

The level of the comparison node Node_com is the level of the first comparison signal Com1 in the example where the falling clock FCLK is the high level and the level of the second comparison signal Com2 in the example where the rising clock RCLK is the high level. Therefore, the level of the comparison node Node_com transitions to the high level when the same level exists for at least 2 consecutive bits in the synchronous data TX_in, and transitions to the low level when consecutive 2 bits have different levels in the synchronous data TX_in.

The driving control signal DS_ISI is a signal which transitions to a high level for the predetermined time, when the comparison node Node_com transitions from the high level to the low level. Therefore, the driving control signal DS_ISI is a signal which retains a low level when consecutive bits of the synchronous data TX_in are different levels and transitions to the high level in the example where the synchronous data TX_in has the same level for at least 2 consecutive bits and then transitions to a different level.

Referring to FIG. 4, the driving control signal DS_ISI is generated as a signal which transitions to the high level in the example where the fourth data 3 and the fifth data 4 of the synchronous data TX_in have the same level as a low level and the sixth data 5 of the synchronous data TX_in is a different level as a high level.

When the driving control signal DS_ISI becomes the high level, the driving force of the data output driving block 300 which drives the synchronous data TX_in and outputs the output data DQ is increased. The data output driving block 300 drives the synchronous data TX_in with a larger driving force during a period in which the driving control signal DS_ISI is the high level than during a period in which the driving control signal DS_ISI is the low level.

As is apparent from the above descriptions, in the semiconductor apparatus in accordance with an embodiment, since data is outputted by changing a driving force for driving data in the example where data of a different level is outputted after data of the same level are consecutively outputted, it may be possible to prevent data from being distorted even though data may be outputted at a high speed.

Figure 5:
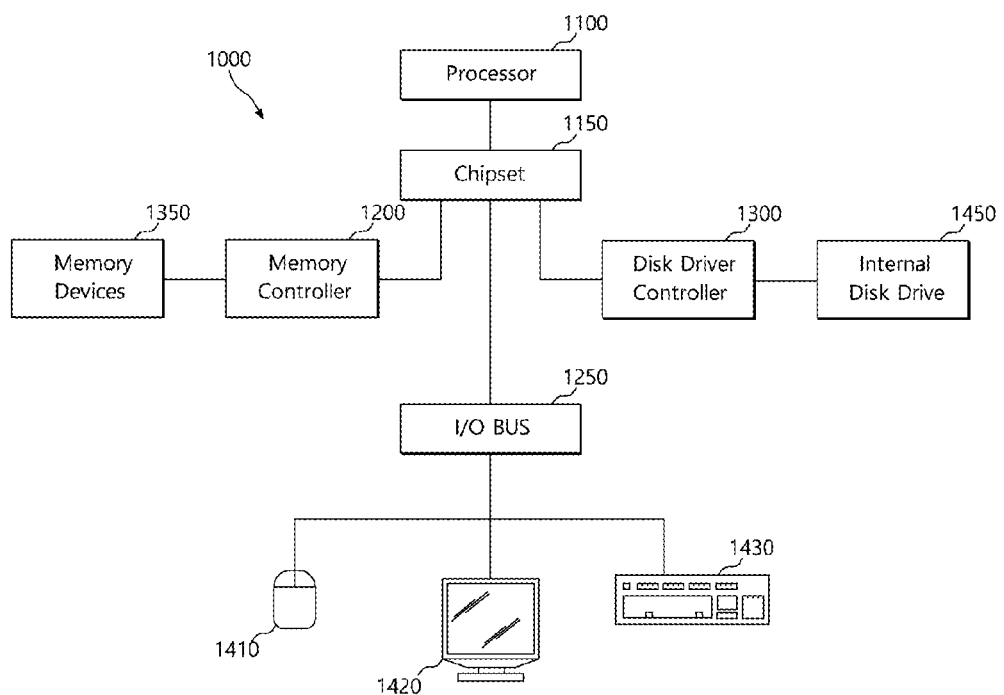
FIG. 5 illustrates a block diagram of an example of a representation of a system employing a semiconductor apparatus in accordance with the various embodiments discussed above with relation to FIGS. 1-4.

The semiconductor apparatus discussed above (see FIGS. 1-4) are particular useful in the design of memory devices, processors, and computer systems. For example, referring to FIG. 5, a block diagram of a system employing the semiconductor apparatus in accordance with the various embodiments are illustrated and generally designated by a reference numeral 1000. The system 1000 may include one or more processors or central processing units ("CPUs") 1100. The CPU 1100 may be used individually or in combination with other CPUs. While the CPU 1100 will be referred to primarily in the singular, it will be understood by those skilled in the art that a system with any number of physical or logical CPUs may be implemented.

A chipset 1150 may be operably coupled to the CPU 1100. The chipset 1150 is a communication pathway for signals between the CPU 1100 and other components of the system 1000, which may include a memory controller 1200, an input/output ("I/O") bus 1250, and a disk drive controller 1300. Depending on the configuration of the system, any one of a number of different signals may be transmitted through the chipset 1150, and those skilled in the art will appreciate that the routing of the signals throughout the system 1000 can be readily adjusted without changing the underlying nature of the system.

As stated above, the memory controller 1200 may be operably coupled to the chipset 1150. The memory controller 1200 may include at least one semiconductor apparatus as discussed above with reference to FIGS. 1-4. Thus, the memory controller 1200 can receive a request provided from the CPU 1100, through the chipset 1150. In alternate embodiments, the memory controller 1200 may be integrated into the chipset 1150. The memory controller 1200 may be operably coupled to one or more memory devices 1350. In an embodiment, the memory devices 1350 may include the at least one semiconductor apparatus as discussed above with relation to FIGS. 1-4, the memory devices 1350 may include a plurality of word lines and a plurality of bit lines for defining a plurality of memory cells. The memory devices 1350 may be any one of a number of industry standard memory types, including but not limited to, single inline memory modules ("SIMMs") and dual inline memory modules ("DIMMs"). Further, the memory devices 1350 may facilitate the safe removal of the external data storage devices by storing both instructions and data.

The chipset 1150 may also be coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number of communications protocols to communicate with the I/O devices 1410, 1420, and 1430. Further, the I/O bus 1250 may be integrated into the chipset 1150.

The disk drive controller 1450 (i.e., internal disk drive) may also be operably coupled to the chipset 1150. The disk drive controller 1450 may serve as the communication pathway between the chipset 1150 and one or more internal disk drives 1450. The internal disk drive 1450 may facilitate disconnection of the external data storage devices by storing both instructions and data. The disk drive controller 1300 and the internal disk drives 1450 may communicate with each other or with the chipset 1150 using virtually any type of communication protocol, including all of those mentioned above with regard to the I/O bus 1250.

It is important to note that the system 1000 described above in relation to FIG. 5 is merely one example of a system employing the semiconductor apparatus as discussed above with relation to FIGS. 1-4. In alternate embodiments, such as cellular phones or digital cameras, the components may differ from the embodiments illustrated in FIG. 5.

While various embodiments have been described above, it will be understood to those skilled in the art that the embodiments described are by way of example only. Accordingly, the semiconductor apparatus described herein should not be limited based on the described embodiments.

What is claimed is:
1. A semiconductor apparatus comprising:
   a data alignment circuit configured to convert parallel type data into rising data and falling data, and output the rising data and the falling data as serial type synchronous data;
   a driving control circuit configured to compare levels of respective bits of the serial type synchronous data, and generate a driving control signal; and
   a data output driving circuit configured to change a driving force in response to the driving control signal, drive the serial type synchronous data with the driving force, and output an output data.
2. The semiconductor apparatus according to claim 1, wherein the data alignment circuit is configured to convert the parallel type data into the rising data and the falling data in response to a pipe input signal, a pipe output signal, a rising clock, and a falling clock.
3. The semiconductor apparatus according to claim 2,
   wherein the data alignment circuit receives and stores the parallel type data in response to the pipe input signal, and
   wherein the data alignment circuit outputs the stored parallel type data as the serial type synchronous data in synchronization with the rising clock and the falling clock in response to the pipe output signal.
4. The semiconductor apparatus according to claim 2, wherein the data alignment block comprises:
   a pipe latch circuit configured to latch the parallel type data when the pipe input signal is enabled, and output latched data as the rising data and the falling data when the pipe output signal is enabled; and a synchronization circuit configured to alternately output the rising data and the falling data as the serial type synchronous data in response to the rising clock and the falling clock.

5. The semiconductor apparatus according to claim 2, wherein the driving control block comprises:
a synchronous signal generation circuit configured to synchronize the rising data and the falling data in response to the rising clock and the falling clock, and output a first synchronous signal, a second synchronous signal, and a third synchronous signal;
a comparison circuit configured to compare the first to third synchronous signals and the rising data, and generate a first comparison signal and a second comparison signal;
an output selection circuit configured to output the first comparison signal to a comparison node when the falling clock is at a high level, and output the second comparison signal to the comparison node when the rising clock is at a high level; and
a pulse generation circuit configured to generate the driving control signal in response to a level of the comparison node.

6. The semiconductor apparatus according to claim 5, wherein the synchronous signal generation circuit synchronizes the rising data with the falling clock and outputs the first synchronous signal,
wherein the synchronous signal generation circuit synchronizes the falling data with the falling clock and outputs the second synchronous signal, and
wherein the synchronous signal generation circuit synchronizes the falling data with the rising clock and outputs the third synchronous signal.

7. The semiconductor apparatus according to claim 6, wherein the synchronous signal generation unit comprises:
a first flip-flop configured to receive the rising data and falling clock, and output the first synchronous signal;
a second flip-flop configured to receive the falling clock and falling data, and output the second synchronous signal; and
a third flip-flop configured to receive the falling data and the rising clock, and output the third synchronous signal.

8. The semiconductor apparatus according to claim 5, wherein the comparison circuit enables the first comparison signal when the first synchronous signal and the second synchronous signal have the same level, and disables the first comparison signal when the first synchronous signal and the second synchronous signal have different levels, and
wherein the comparison circuit enables the second comparison signal when the rising data and the third synchronous signal have the same level, and disables the second comparison signal when the rising data and the third synchronous signal have different levels.

9. The semiconductor apparatus according to claim 8, wherein the comparison unit comprises:
a first logic gate configured to receive the first synchronous signal and the second synchronous signal, and output the first comparison signal; and
a second logic gate configured to receive the falling clock and the third comparison signal, and output the second comparison signal.

10. The semiconductor apparatus according to claim 5, wherein the pulse generation circuit generates the driving control signal, the driving control signal enabled for a predetermined time, when the level of the comparison node transitions to a specified level.

11. The semiconductor apparatus according to claim 5, wherein the output selection circuit comprises:
a first inverter configured to receive the falling clock;
a first pass gate coupled to the comparison node and configured to receive the output of the first inverter, the first comparison signal, and the falling clock;
a second inverter configured to receive the rising clock; and
a second pass gate coupled to the comparison node and configured to receive the output of the second inverter, the second comparison signal, and the rising clock.

12. The semiconductor apparatus according to claim 2, wherein the data output driving circuit comprises:
a driver configured to drive the serial type synchronous data with a predetermined driving force, and output the output data; and
a control driver configured to drive the serial type synchronous data when the driving control signal is enabled, and output the output data.

13. A semiconductor apparatus comprising:
a data alignment circuit configured to convert parallel type data into rising data and falling data, and output the rising data and the falling data as serial type synchronous data;
a driving control circuit configured to enable a driving control signal when a value of data is changed after the same data value is continuously retained for at least 2 bits in the serial type synchronous data; and
a data output driving circuit configured to drive the serial type synchronous data with a driving force changeable according to the driving control signal, and output output data.

14. The semiconductor apparatus according to claim 13, wherein the data alignment circuit comprises:
a pipe latch circuit configured to output the parallel type data as the rising data and the falling data; and
a synchronization unit configured to synchronize the rising data with a rising clock, synchronize the falling data with a falling clock, and alternately output the synchronized rising data and the synchronized falling data as the serial type synchronous data.

15. The semiconductor apparatus according to claim 13, wherein the driving control circuit comprises:
a synchronous signal generation circuit configured to synchronize the rising data with the falling clock and generate a first synchronous signal, synchronize the falling data with the falling clock and generate a second synchronous signal, and synchronize the falling data with the rising clock and generate a third synchronous signal;
a comparison circuit configured to compare levels of the first and second synchronous signals and generate a first comparison signal, and compare the third synchronous signal and the rising data and generate a second comparison signal;
an output selection circuit configured to output the first comparison signal to a comparison node in response to the falling clock, and output the second comparison signal to the comparison node in response to the rising clock; and
a pulse generation circuit configured to generate the driving control signal in response to a level of the comparison node.

16. The semiconductor apparatus according to claim 13, wherein the data output driving circuit drives the serial type synchronous data with a larger driving force when the driving control signal is enabled than when the driving control signal is disabled, and outputs the output data.

17. The semiconductor apparatus according to claim 16, wherein the data output driving circuit comprises:
- a driver configured to drive the serial type synchronous data, and output the output data; and
- a control driver configured to drive the serial type synchronous data and output the output data, only when the driving control signal is enabled.

18. A semiconductor apparatus comprising:
- a data output driving circuit configured to change a driving force in response to a driving control signal, drive synchronous data with the changed driving force, and output an output data; and
- a driving control circuit configured to generate the driving control signal in response to values of consecutive data of the synchronous data.

19. The semiconductor apparatus according to claim 18, wherein the data output driving circuit drives the synchronous data with a larger driving force when the driving control signal is enabled than when the driving control signal is disabled, and outputs the output data.

20. The semiconductor apparatus according to claim 18, wherein the driving control circuit enables the driving control signal when a value of data is changed after the same data value is continuously retained for at least 2 bits in the synchronous data.

* * * * *